United States Patent
Shibata et al.

(10) Patent No.: US 8,251,136 B2
(45) Date of Patent: Aug. 28, 2012

(54) COOLING DEVICE

(75) Inventors: Hiroshi Shibata, Aichi (JP); Nobuyuki Yasui, Gifu (JP); Mutsuhiko Matsumoto, Aichi (JP); Kouji Sinzaki, Aichi (JP); Toshikazu Yamaguchi, Aichi (JP); Naoyuki Funada, Aichi (JP); Keisuke Tuzi, Aichi (JP); Takahiro Sahasi, Aichi (JP); Satoshi Ousaka, Aichi (JP); Keisuke Hagimoto, Aichi (JP)

(73) Assignee: Panasonic Corporation, Osaka (JP)

( * ) Notice: Subject to any disclaimer, the term of this patent is extended or adjusted under 35 U.S.C. 154(b) by 508 days.

(21) Appl. No.: 12/526,303

(22) PCT Filed: Mar. 12, 2008

(86) PCT No.: PCT/JP2008/000538
§ 371 (c)(1),
(2), (4) Date: Aug. 7, 2009

(87) PCT Pub. No.: WO2008/111310
PCT Pub. Date: Sep. 18, 2008

(65) Prior Publication Data
US 2010/0218919 A1    Sep. 2, 2010

(30) Foreign Application Priority Data

Mar. 13, 2007 (JP) ................................. 2007-063182

(51) Int. Cl.
*F24F 11/04* (2006.01)
(52) U.S. Cl. ........................... 165/244; 165/54; 361/696
(58) Field of Classification Search .................. 165/200, 165/53, 54, 122, 166; 454/184; 361/695, 361/696; 62/259.2, 249
See application file for complete search history.

(56) References Cited

U.S. PATENT DOCUMENTS

| 5,467,250 | A | * | 11/1995 | Howard et al. | ............... 361/696 |
| 6,026,891 | A | | 2/2000 | Fujiyoshi et al. | |
| 6,039,111 | A | | 3/2000 | Kawaguchi et al. | |
| 6,170,562 | B1 | * | 1/2001 | Knoblauch | ............... 165/104.33 |
| 6,612,365 | B1 | * | 9/2003 | Saishu et al. | ..................... 165/54 |
| 6,789,612 | B1 | * | 9/2004 | Okamoto et al. | ........ 165/104.34 |

(Continued)

FOREIGN PATENT DOCUMENTS

JP                 5-8253 U         2/1993

(Continued)

OTHER PUBLICATIONS

The supplementary extended European search report, issued in EP application No. 08720424.4., dated Jul. 21, 2010. International Search Report of PCT Application No. PCT/JP2008/000538 dated May 20, 2008.

*Primary Examiner* — Ljiljana Ciric
*Assistant Examiner* — Devon Russell
(74) *Attorney, Agent, or Firm* — Panasonic Patent Center; Dhiren Odedra; Kerry Culpepper

(57) ABSTRACT

A control device accommodating unit (15) is provided in a section (50) accommodating an indoor air blower (7) adjacently to an indoor air flow-in port (16), and an impeller (7c) of the indoor air blower (7) is sequentially opposite to the indoor air flow-in port (16) and the control device accommodating unit (15) by rotation of the impeller (7c), and a space (51) is formed between the indoor air flow-in port (16) and the control device accommodating unit (15). In this configuration, it is possible to obtain a cooling device decreased in drop of air flow rate and drop of cooling performance due to mounting a control device (14).

9 Claims, 16 Drawing Sheets

U.S. PATENT DOCUMENTS

| | | | |
|---|---|---|---|
| 6,877,551 B2* | 4/2005 | Stoller | 165/47 |
| 7,100,682 B2* | 9/2006 | Okamoto et al. | 165/104.34 |
| 7,466,557 B2* | 12/2008 | Watanabe | 361/752 |
| 2004/0188073 A1* | 9/2004 | Okamoto et al. | 165/165 |
| 2008/0204999 A1* | 8/2008 | Clidaras et al. | 361/696 |

FOREIGN PATENT DOCUMENTS

| | | |
|---|---|---|
| JP | 10-002696 A | 1/1998 |
| JP | 10-190270 A | 7/1998 |
| JP | 10-227554 A | 8/1998 |
| JP | 2007-116118 | 5/2007 |

* cited by examiner

COOLING DEVICE

TECHNICAL FIELD

The present invention relates to a cooling device such as a heating element storing box having a heating element in its inside.

BACKGROUND ART

Recently, electronic components are becoming higher in performance and the packing density of electronic components on a control board is becoming higher, and the amount of heat generation from the control board is increasing dramatically. As a result, the internal temperature of the heating element storing box for accommodating electronic components tends to be higher, and the temperature in the heating element storing box has a vital effect on guarantee of operation and product life of electronic components mounted on the control board. It is hence demanded to cool the temperature in the heating element storing box below a specific point by using a cooling device.

Conventionally, this kind of cooling device is known to include a heat transfer plate as a sensible heat exchanger, an indoor air suction fan as an indoor air blower, an outdoor air suction fan as an outdoor air blower, and terminal blocks. Such conventional cooling device is disclosed, for example, in patent document 1 (Japanese Utility Model Application Laid-Open No. H5-8253).

The conventional cooling device is described below while referring to FIG. 16. Cooling device 101 is provided inside of door 102 of control panel 100 as a heating element storing box, and is separated into control panel inner space 103 (hereinafter called space 103) and control panel outer space 104 (hereinafter called space 104). Cooling device 101 has case 105 formed like a long box, and flange 106 formed vertically and laterally for mounting cooling device 101 on door 102. The front side of flange 106 is provided with packing 107 for keeping airtight with door 102.

Case 105 includes indoor air intake hole 108 as an indoor air suction port, and indoor air exhaust hole 109 as an indoor air blow port. Heat transfer plate 110 is accommodated in the center of case 105. Heat transfer plate 110 is made of a thin plate folded in corrugated shape, and multiple barrier walls are formed at equal intervals, and both end portions in the longitudinal direction are alternately connected every one other by bridge portions, thereby forming a plurality of indoor air side square passages 111 (hereinafter called passages 111) and outdoor air side square passages 112 (hereinafter called passages 112) positioned alternately. Indoor air intake hole 108 communicates with passages 111. Indoor air exhaust hole 109 is provided with indoor air suction fan 113 (hereinafter called fan 113) as an indoor air blower by way of mounting plate 114. The upper edge of mounting plate 114 has slope 114A for deflecting the flow of indoor air.

In the middle of door 102, outdoor air intake hole 115 is provided as an outdoor air suction port, and outdoor air exhaust hole 116 as an outdoor air blow port is formed in the upper part of door 102. Outdoor air intake hole 115 communicates with passages 112. Outdoor air exhaust hole 116 is provided with outdoor air suction fan 117 (hereinafter called fan 117) as an outdoor air blower by way of mounting plate 118.

Terminal blocks 119 are provided in the upper part of case 105 and in the upper part of mounting plate 114. Lead wire 113A of fan 113 and lead wire 117A of fan 117 are respectively connected to the inside of terminal blocks 119, and are connected outside of case 105 by using wires 120. Wires (not shown) are distributed from either one of two terminal blocks 119.

When cooling device 101 is put in operation, the high temperature air in space 103 is sucked in from indoor air intake hole 108 as indicated by arrow a, and is distributed in passages 111, and is returned again into space 103 by means of fan 113. On the other hand, the low temperature air in space 104 is sucked in from outdoor air intake hole 115 as indicated by arrow b, and is distributed in passages 112, and is returned again into space 104 by means of fan 117. By such forced convection, heat is exchanged through barrier walls of heat transfer plate 110, and the air in control panel 100 is cooled.

Recently, in order to operate cooling device 100 more efficiently, it has been attempted to develop cooling device 100 having a control device (not shown) for controlling the operation of fan 113 and the operation of fan 117. In such conventional cooling device 100, however, the control device is installed in a section in which fan 113 or fan 117 is disposed. Therefore, depending on the location of the control device, the air flow rate may be lowered, or the air blowing state to the heat transfer plate may be biased, and the cooling capacity may tend to decline.

Patent document 1: Japanese Utility Model Application Laid-Open No. H5-8253

SUMMARY OF THE INVENTION

The present invention provides a cooling device decreased in drop of air flow rate and drop of cooling capacity due to mounting of control device.

The heat exchanger of the present invention includes a box body, an indoor air channel, an outdoor air channel, an indoor air blower, an outdoor air blower, a heat exchanger, a control device, and a control device accommodating unit, and the box body is provided in a heating element storing box for storing a heating element, and at least one side is formed by a detachable panel, and the indoor air channel sucks in and circulates the air in the heating element storing box, the outdoor air channel sucks in and circulates the outdoor air, the indoor air blower conveys air into the indoor air channel, the outdoor air blower conveys air into the outdoor air channel, the heat exchanger has an indoor air flow-in port, and exchanges sensible heat between the air in the indoor air channel and the air in the outdoor air channel, the control device controls the indoor air blower and the outdoor air blower, and the control device accommodating unit accommodates the control device. Further, the indoor air blower and the outdoor air blower are installed so that the axial direction of the rotary shaft and the air suction direction may be parallel to each other, and the sensible heat exchanger is disposed at the downstream side of the indoor air blower and the outdoor air blow, and the indoor air flow-in port and the control device accommodating unit are disposed adjacently to the accommodating section of the indoor air blower, and impellers of the indoor air blower are opposite to each other in the sequence of the indoor air flow-in port and the control device accommodating unit, by rotation of the impellers, and a space is further formed between the indoor air flow-in port and the control device accommodating unit. By this configuration, it hence realizes a cooling device decreased in drop of air flow rate and drop of cooling capacity due to mounting of control device.

DESCRIPTION OF REFERENCE MARKS

Figure 1:
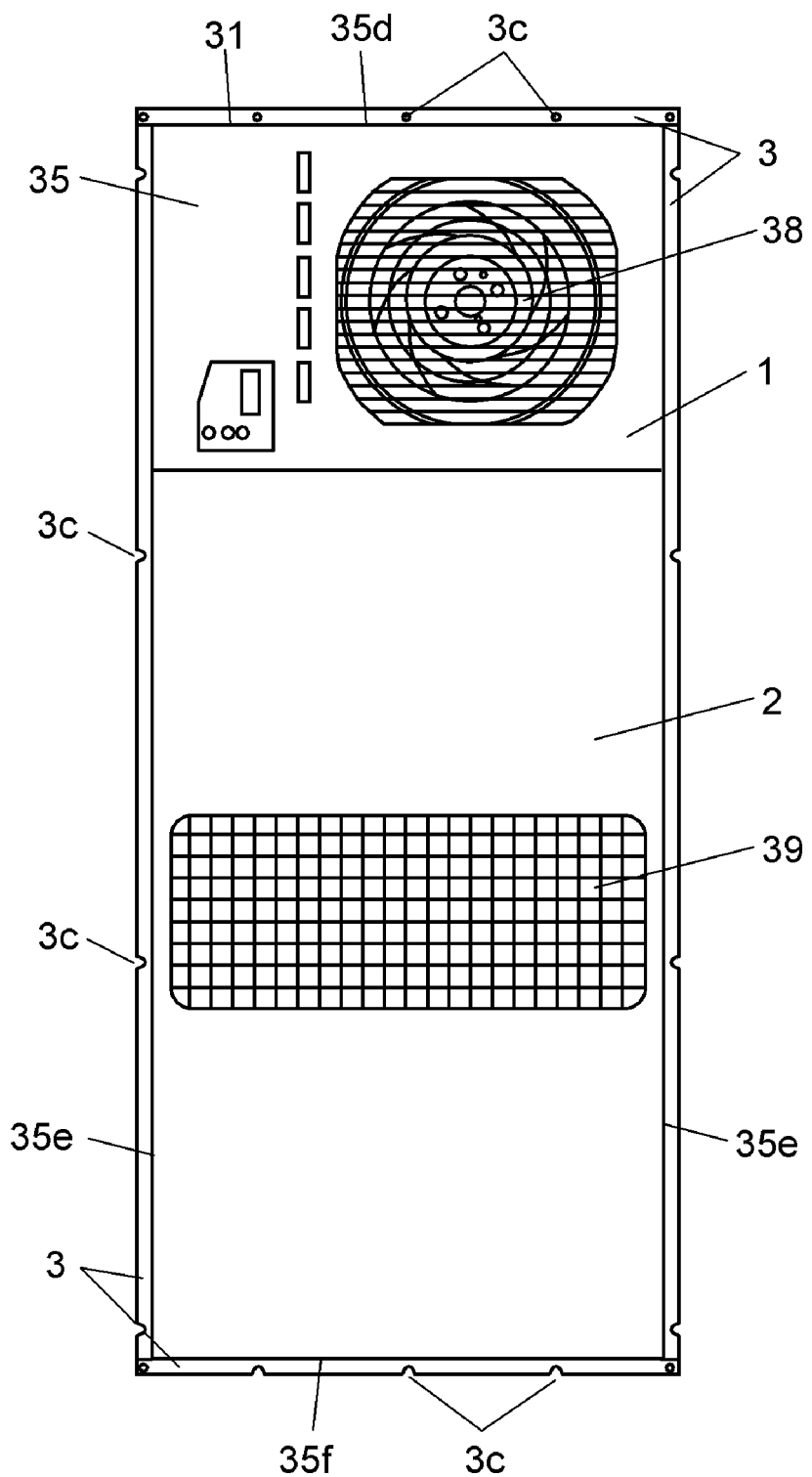
FIG. 1 is a front view of a cooling device in preferred embodiment 1 of the present invention.

1 First panel
2 Second panel
3, 3a, 3b Flange
3c Opening part
4 Heating element storing box
5 Fixing screw
6 Sealing member
7 Indoor side turbo fan
7a, 8a Rotary shaft
7b Rotating direction
7c, 8c Impeller
8 Outdoor side turbo fan
9 Heat exchanger
10 First heat transfer plate
11 Second heat transfer plate
12 Indoor side air channel
13 Outdoor side air channel
14 Control device
14a Printed board
15 Controller box
15a Back side
16 Indoor air flow-in port
16a Outdoor air flow-in port
17 Indoor air duct
18 Intake port
19 Exhaust port
20 Corner part
21 Drain hole
22 Round hole
23 U-cut
24 Ridge portion
25 Caulking agent
26 Rivet
27 Waterproof tape
28 Sealing and insulating part
35 Case
35a, 35b, 35c Plate metal member
35d Top face
35e Lateral face
35f Bottom face
38 Indoor air intake hole
39 Indoor air exhaust hole
45 Outdoor air intake hole
46 Outdoor air exhaust hole
50, 50a, 50b Section
51 Space
52, 53 Blow-out port
61, 62 Circulation
63, 64 Air stream

PREFERRED EMBODIMENTS FOR CARRYING OUT THE INVENTION

Preferred embodiments of the invention are described below while referring to the accompanying drawings.

Preferred Embodiment 1

Figure 2:
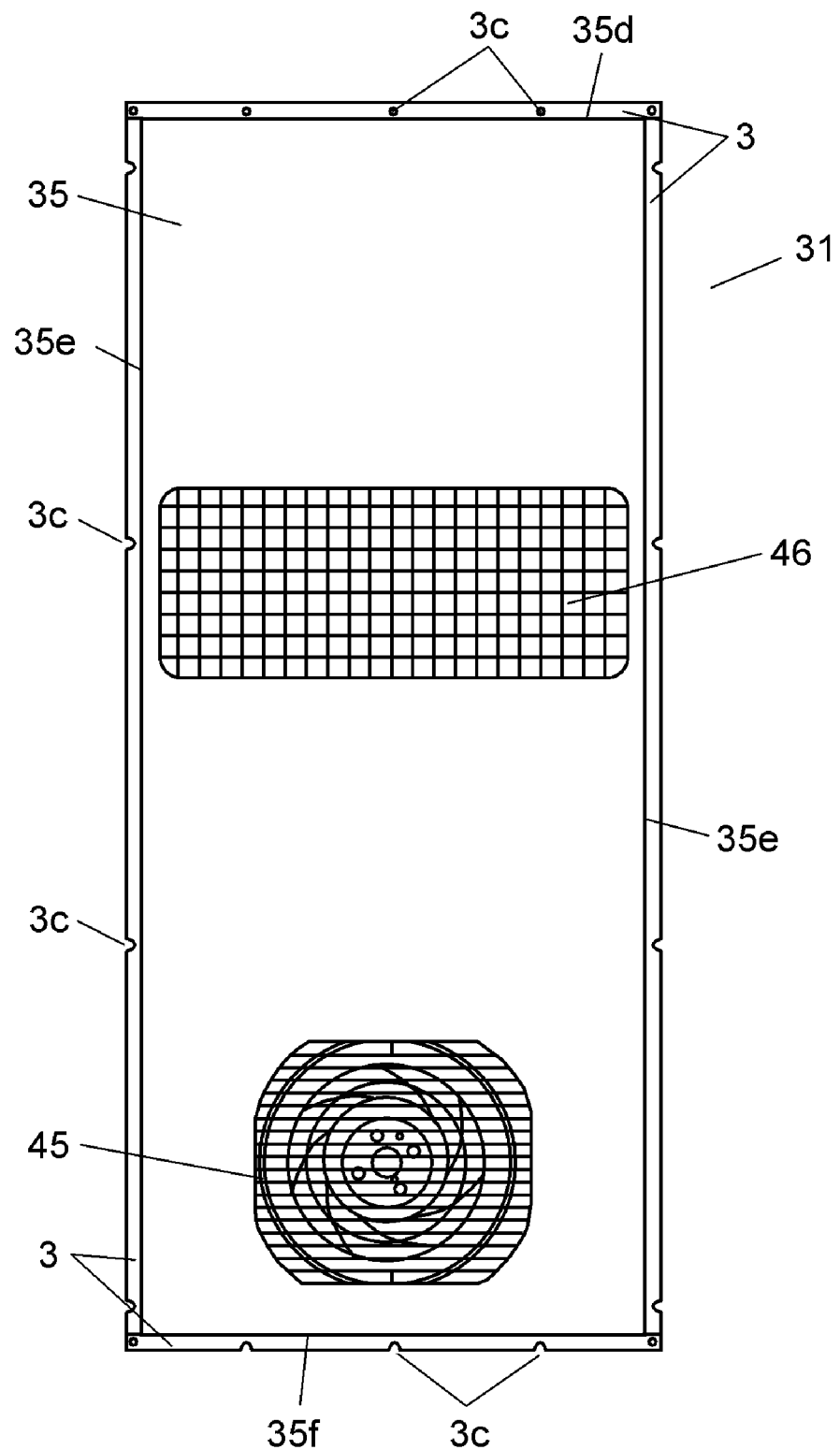
FIG. 2 is a rear view of the cooling device shown in FIG. 1.
Figure 3:
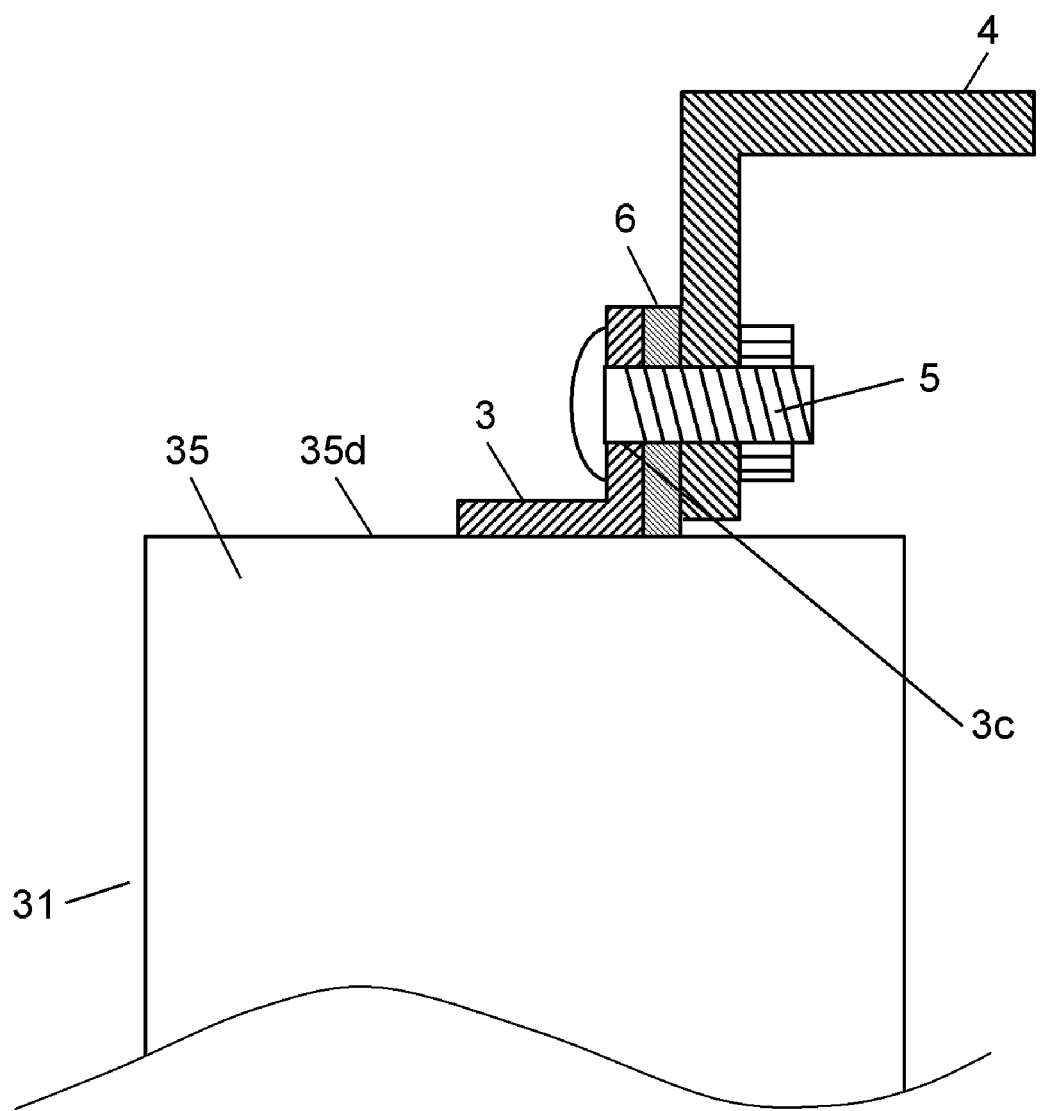
FIG. 3 is a schematic side structural diagram showing a state of the cooling device shown in FIG. 1 being installed in a heating element storing box.
Figure 4:
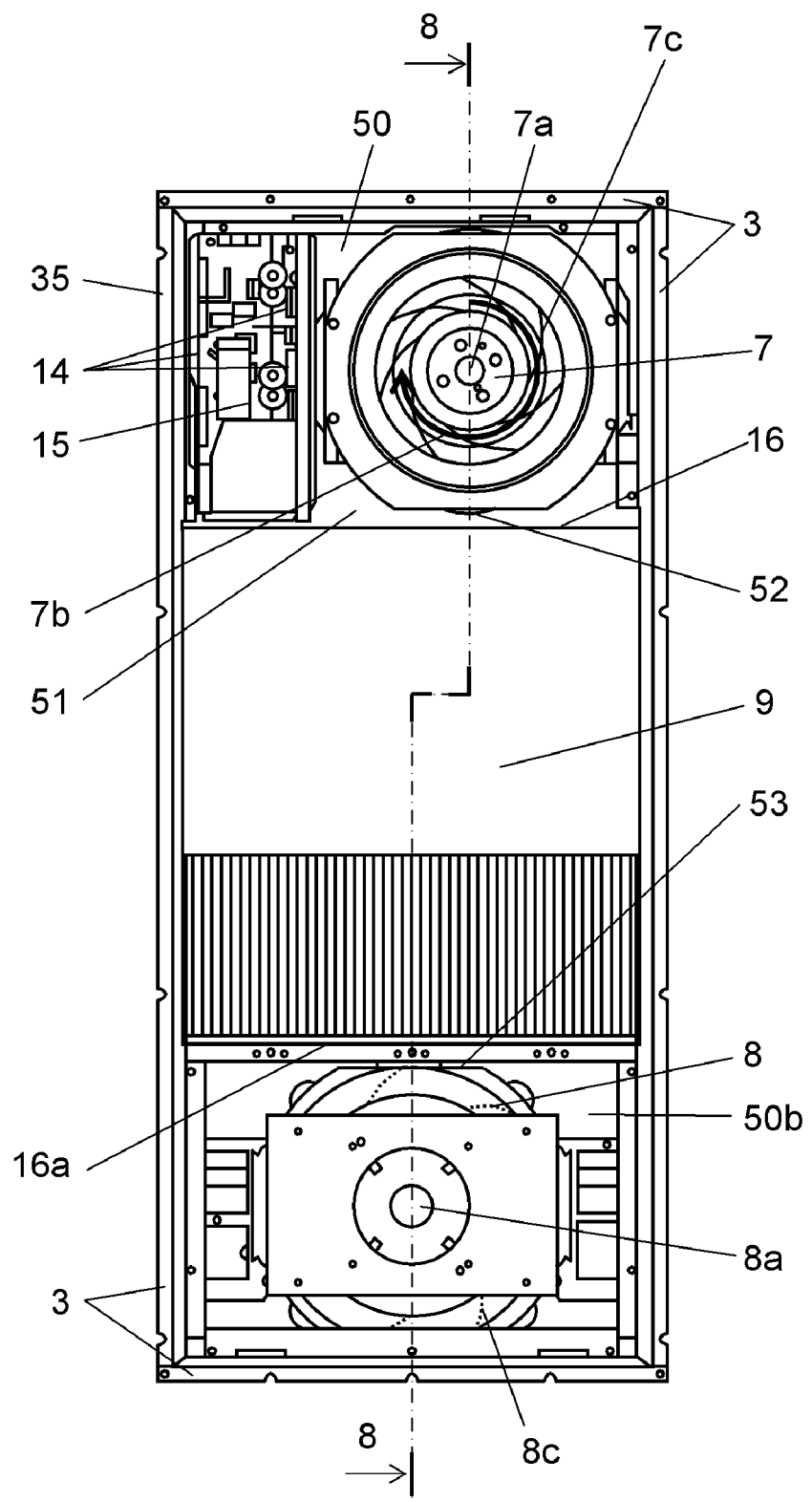
FIG. 4 is an internal structural diagram of the cooling device shown in FIG. 1.
Figure 5:
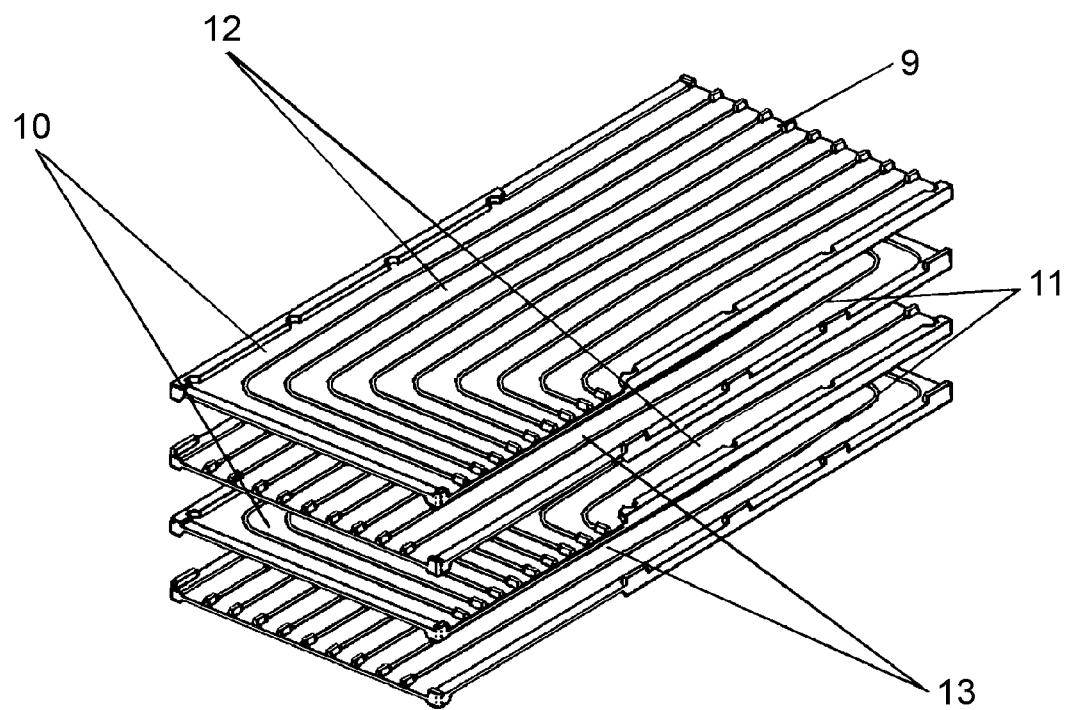
FIG. 5 is a partial exploded perspective view of a heat exchanger of the cooling device shown in FIG. 1.
Figure 6:
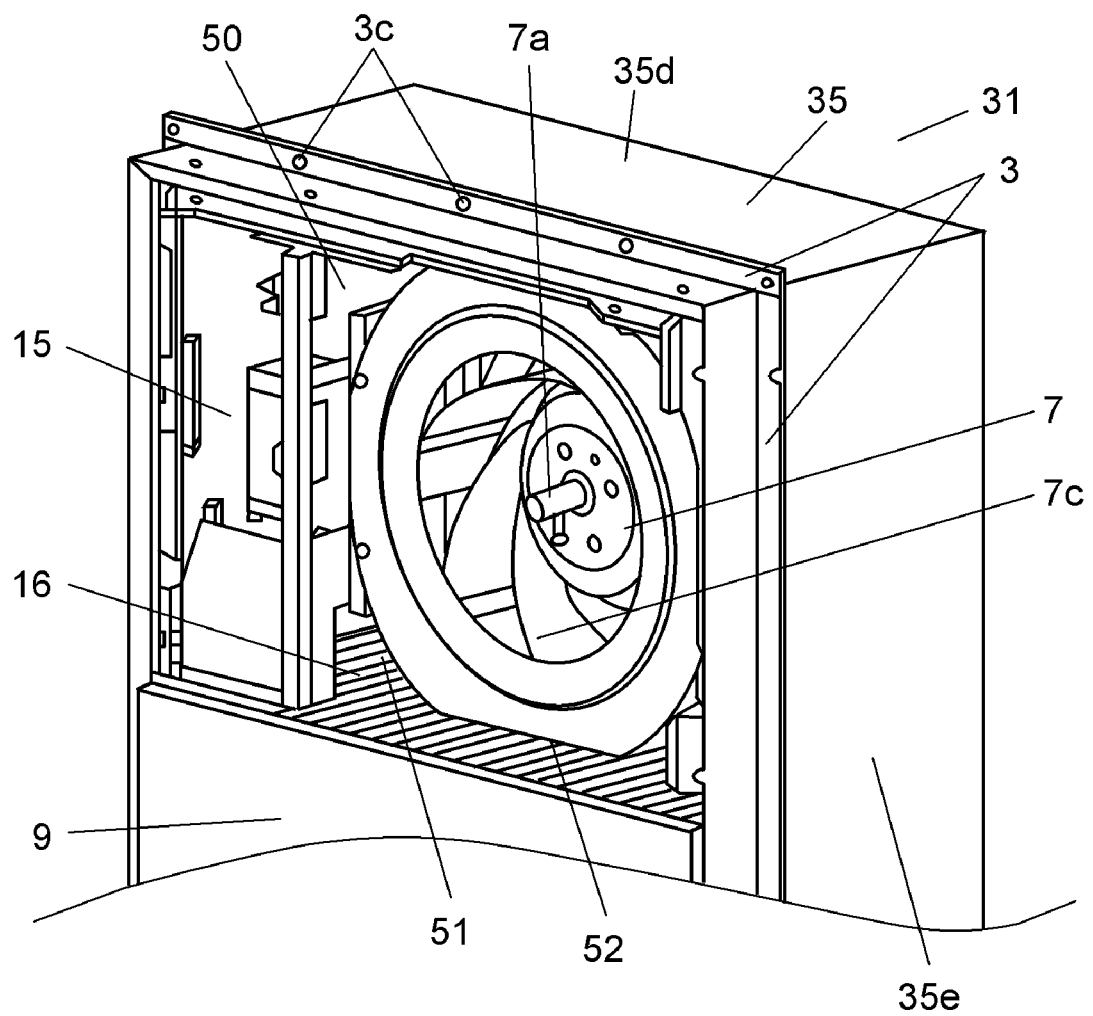
FIG. 6 is a magnified perspective view of accommodating section of indoor side turbo fan of the cooling device shown in FIG. 1.
Figure 7:
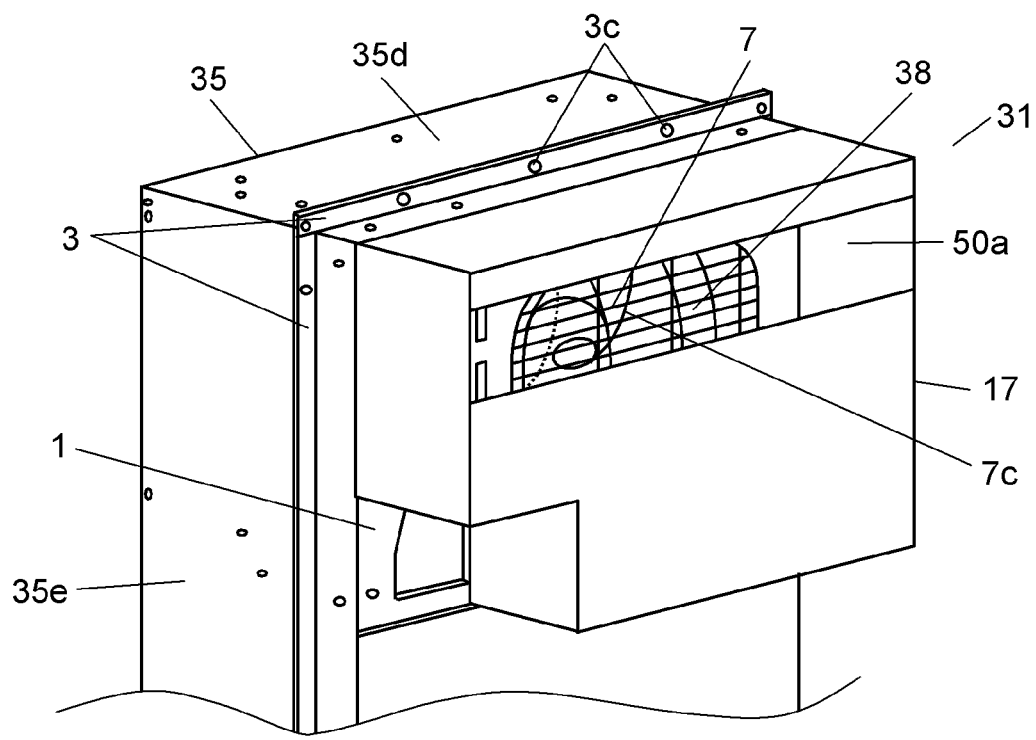
FIG. 7 is a schematic perspective view showing a mounting state of indoor air duct of the cooling device shown in FIG. 1.
Figure 8:
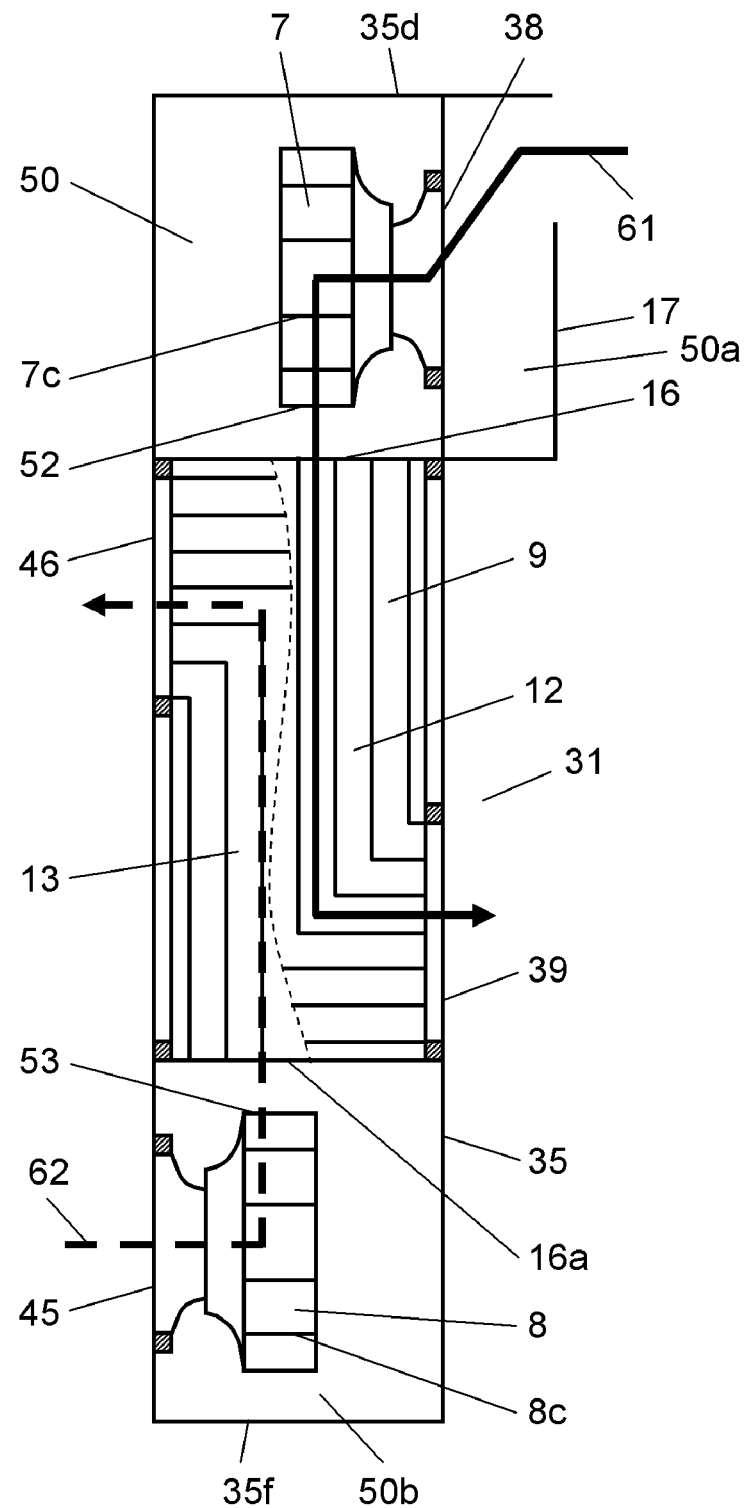
FIG. 8 is a schematic sectional structural diagram along section line 8-8 of the cooling device shown in FIG. 4.

Preferred embodiment 1 of the present invention is described while referring to FIG. 1 to FIG. 8. FIG. 1 is a front view of cooling device 31 in preferred embodiment 1 of the present invention. FIG. 2 is a rear view of cooling device 31. FIG. 3 is a schematic side structural diagram showing a state of cooling device 31 being installed in heating element storing box 4 (hereinafter called box 4). FIG. 4 is an internal structural diagram of cooling device 31. FIG. 5 is a partial exploded perspective view of heat exchanger 9 of cooling device 31. FIG. 6 is a magnified perspective view of section 50 for accommodating indoor side turbo fan 7 (hereinafter called fan 7) of cooling device 31. FIG. 7 is a schematic perspective view showing a mounting state of indoor air duct 17 (hereinafter called duct 17) of cooling device 31. FIG. 8 is a schematic sectional structural diagram along section line 8-8 of cooling device 31 shown in FIG. 4.

As shown in FIG. 1 and FIG. 2, the housing of cooling device 31 is composed of case 35 as a box body, and first panel 1 (hereinafter called panel 1) and second panel 2 (hereinafter called panel 2). Panels 1 and 2 are detachably fitted to case 35. Panels 1 and 2 respectively form a part of the box body. At the back side of case 35, there are outdoor air intake hole 45 for taking the outdoor air into case 35, and outdoor air exhaust hole 46 for exhausting outdoor air out of case 35. The outdoor air is the air outside of box 4 and cooling device 31, that is, the air outside of the machine. Top face 35d, both lateral faces 35e, and bottom face 35f of case 35 are individually provided with flanges 3. Panel 1 has indoor air intake hole 38 for taking the indoor air, that is, the air in box 4 into case 35. Panel 2 has indoor air exhaust hole 39 for returning the indoor air taken into case 35 back into box 4. The inside of box 4 contains electronic components, or heating elements (not shown) as heat generation source such as control board.

As shown in FIG. 3, flanges 3 are fixed to box 4 by using fixing screws 5 (hereinafter called screws 5). Thus, cooling device 31 is tightened to box 4. That is, flanges 3 have the function of fixing member for installing cooling device 31 in box 4, and screws 5 have the function of tightening member. Flanges 3 have openings 3c, and screws 5 fix flanges 3 and box 4 by way of openings 3c. Between flanges 3 and box 4, sealing member 6 made of neoprene rubber or the like is disposed. By means of sealing member 6, invasion of rainwater or dust into box 4 from the fixing part of cooling device 31 and box 4 can be prevented.

Further, as shown in FIG. 4, as an indoor air blower, fan 7 is disposed in the upper part of case 35. As an outdoor air blower, outdoor side turbo fan 8 (hereinafter called fan 8) is disposed in the lower part of case 35. Fan 7 has impeller 7c, and fan 8 has impeller 8c. By rotation of impellers 7c, 8c, fans 7, 8 blow the air. Rotary shaft 7a of fan 7 and rotary shaft 8a of fan 8 disposed so that the axial direction and air sucking direction of rotary shafts 7a, 8a may be parallel to each other. Between fan 7 and fan 8, there is heat exchanger 9 for exchanging sensible heat between the indoor air blown by fan 7 and the outside air blown by fan 8. Heat exchanger 9 has indoor air flow-in port 16 (hereinafter called flow-in port 16) for sucking the indoor air into heat exchanger 9, and outdoor air flow-in port 16a (hereinafter called flow-in port 16a) for sucking the outdoor air into heat exchanger 9. Flow-in port 16 is provided at the downstream side of blow-out port 52 of fan 7, opposite to blow-out port 52. Flow-in port 16a is provided at the downstream side of blow-out port 53 of fan 8, opposite to blow-out port 53. Thus, heat exchanger 9 provided at the downstream side of fan 7 and fan 8.

As shown in FIG. 5, moreover, heat exchanger 9 is formed by laminating a multiplicity of first heat transfer plates 10 (hereinafter called heat transfer plates 10), and a multiplicity of second heat transfer plates 11 (hereinafter called heat transfer plates 11). In heat transfer plates 10, 11, sheet materials such as polystyrene sheets are formed in vacuum, and a multiplicity of L-shaped air channels are formed. By the multiplicity of heat transfer plates 10, 11, individually independent indoor side air channels 12 (hereinafter called air channels 12) and outdoor side air channels 13 (hereinafter called air channels 13) are formed. Air channel 12 forms the indoor air channel, and air channel 13 forms the outdoor air channel. The outer side of heat transfer plates 10 and the outer side of heat transfer plates 11 are thermally fused, and the multiplicity of heat transfer plates 10 and the multiplicity of heat transfer plates 11 are integrally formed. In FIG. 5, only two each of heat transfer plates 10, 11 are shown. However, the number of heat transfer plates 10, 11 is not limited to two. The individual configuration may be determined in consideration of the required performance of heat exchange of heat exchanger 9.

As shown in FIG. 6, in order to control the rotating speed of fan 7 and the rotating speed of fan 8, control device 14 having a microcomputer, and other electronic components are accommodated in controller box 15 (hereinafter called box 15) as a control device accommodating unit. For example, control device 14 has a configuration of printed board. Box 15 is contained in a same section as section 50 where fan 7 in the upper part of case 35 is stored. Further, box 15 is stored at the side in opposite direction to flow-in port 16, with respect to the tangential direction of rotation of fan 7 rotating clockwise in rotating direction 7b to rotary shaft 7a of fan 7. That is, as shown in FIG. 4, box 15 is disposed so that the tangential direction of rotation of fan 7 may be at the upward side from the horizontal direction when stored in section 50 for accommodating fan 7. Flow-in port 16 is disposed so that the tangential direction of rotation of fan 7 may be at the downward side from the horizontal direction. Flow-in port 16 and box 15 are disposed adjacently to each other in section 50 for accommodating fan 7, and impeller 7c is sequentially opposite to flow-in port 16 and box 15 by rotation of impeller 7c. That is, as shown in FIG. 4 and FIG. 6, flow-in port 16 is disposed downward toward fan 7, and box 15 is disposed at the left side toward fan 7. Box 15 is disposed so that space 51 may be formed between box 15 and flow-in port 16. Space 51 exists on blow-out port 52 in the tangential direction of rotating direction 7b of fan 7.

As shown in FIG. 7, for feeding indoor air into indoor air intake hole 38, as an indoor air feed unit, indoor air duct 17 (hereinafter called duct 17) is fixed in panel 1 so as to surround indoor air intake hole 38.

In this configuration, as shown in FIG. 8, the indoor air in box 4 passes through duct 17, and is taken into case 35 from indoor air intake hole 38. The indoor air blown out from fan 7 is sent into heat exchanger 9, and the sensible heat is exchanged with the outdoor air by heat exchanger 9, and is cooled. Then the indoor air is returned to box 4 from indoor air exhaust hole 39. That is, circulation 61 of indoor air passing through passage 12 is formed.

On the other hand, the outdoor air is taken into case 35 from outdoor air intake hole 45 and is blown out from fan 8 into heat exchanger 9 is exchanged in sensible heat with the indoor air by heat exchanger 9. Then the outdoor air is exhausted to outdoor from outdoor air exhaust hole 46. That is, circulation 62 of outdoor air passing through passage 13 is formed.

At this time, since fan 7 rotates clockwise, the air blow out from fan 7 is supplied also into space 51 between heat exchanger 9 and beneath box 15 disposed at the left side of fan 7. As a result, the air is smoothly passed also into flow-in port 16 beneath box 15, and is sent entirely into air channel 12 of heat exchanger 9. As a result, it is effective to decrease drop of air flow rate and drop of cooling capacity due to increase of pressure loss by reduction of air channel in heat exchanger 9.

As explained in the present preferred embodiment 1, in case 35, detachable plate members are formed by panels 1, 2, and panels 1, 2 are two divided sections. But, the same action and effects are obtained if panels 1, 2 are formed integrally or divided into more than two pieces.

Fan 7 is used as an indoor air blower and fan 8 is used as an outdoor air blower. Not limited to this configuration, the same action and effects are obtained if similar fans are used.

As heat exchanger 9, a multiplicity of heat transfer plates 10, 11 are laminated in which polystyrene sheets are molded in vacuum, and L-shaped air channels are formed. Further, by the multiplicity of heat transfer plates 10, 11, individually independent air channels 12, 13 are formed, and the outer surfaces of heat transfer plates 10, 11 are thermally fused, an integrated heat exchanger 9 is composed. However, as far as the indoor air and outdoor air flow in mutually independent air channels 12, 13 and the sensible heat is exchanged, the same action and effects are obtained if heat exchangers of other manufacturing process, material or air channel shape are used.

As sealing member 6, neoprene rubber is used. However, the same action and effects are obtained if an elastic material of waterproof and airtight properties is used.

Preferred Embodiment 2

Figure 9:
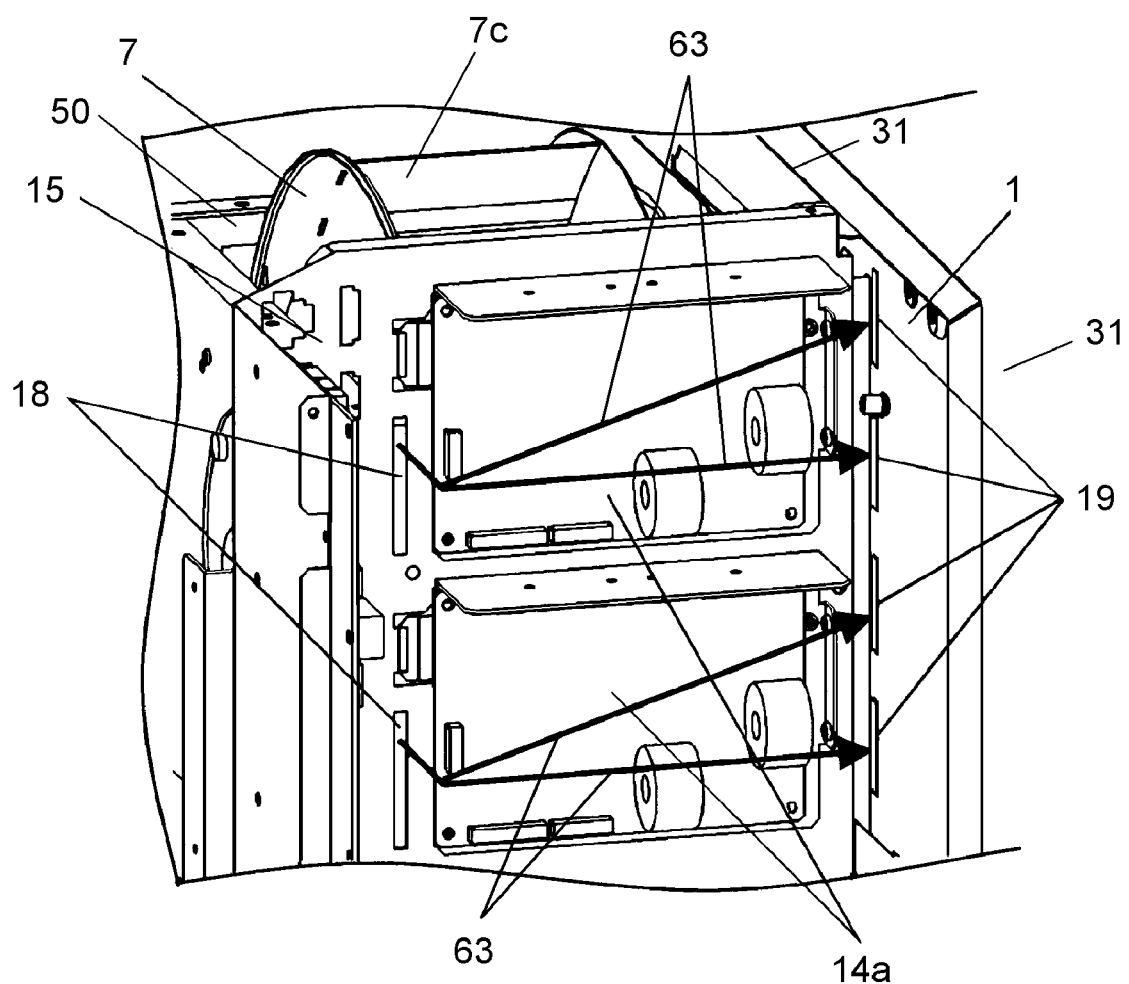
FIG. 9 is an internal schematic perspective view of controller box in a cooling device in preferred embodiment 2 of the present invention.
Figure 10:
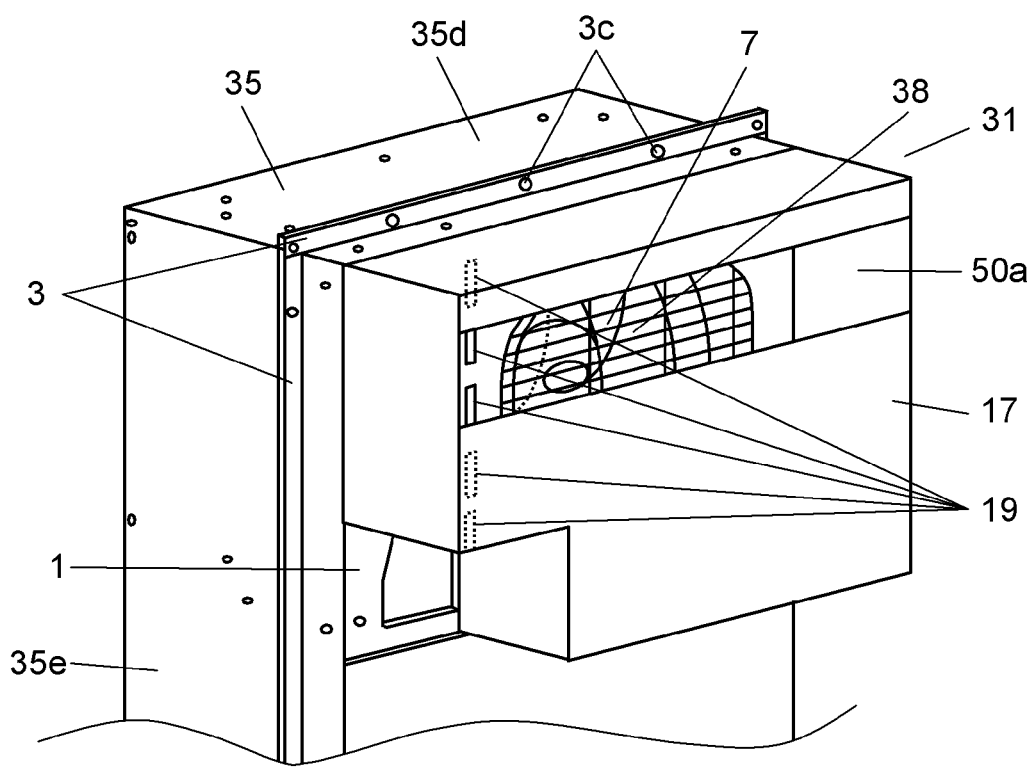
FIG. 10 is a schematic perspective view showing relative positions of indoor air duct and exhaust port of controller box of the cooling device shown in FIG. 9.

Preferred embodiment 2 of the present invention is described below while referring to FIG. 9 and FIG. 10. Same components as in preferred embodiment 1 are identified with same reference numerals, and detailed description is omitted. FIG. 9 is an internal schematic perspective view of controller box 15 in cooling device 31 in preferred embodiment 2 of the present invention. FIG. 10 is a schematic perspective view showing relative positions of indoor air duct 17 and exhaust port 19 of controller box 15.

As shown in FIG. 9 and FIG. 10, as a flow-in port of control device accommodating unit, intake port 18 of box 15 communicates with same section 50 as blow-out port 52 of fan 7. That is, intake port 18 communicates with section 50 at high pressure side of fan 7, and is also provided near printed board 14a contained in box 15. Printed board 14a is a part of control device 14, and is a heating element which generates a large amount of heat. As a result, printed board 14a exists near the high temperature area in box 15. Therefore, intake port 18 is disposed in the high temperature area in box 15.

On the other hand, as a flow-out port of control device accommodating unit, exhaust port 19 of box 15 is formed on panel 1 near printed board 14a in box 15. That is, exhaust port 19 is also disposed near the high temperature area in box 15. Further, exhaust port 19 communicates with duct 17. That is, exhaust port 19 communicates with section 50a at low pressure side.

In this configuration, a part of the air blown out from fan 7 forms air stream 63 to flow from intake port 18 into box 15. The air flowing into box 15 cools printed board 14a, and is exhausted from exhaust port 19 into duct 17 outside of box 15. The inside of duct 17 is suction section 50a of fan 7. As a result, since box 15 is at lower pressure than intake port 18, the air securely passes into box 15. That is, duct 17 communicating with exhaust port 19 communicates with indoor air intake port 38, and exhaust port 19 is at lower pressure than intake port 18. Hence, a pressure difference occurs between intake port 18 and exhaust port 19, and the air is passed into box 15, so that control device 14 is cooled effectively.

Intake port 18 and exhaust port 19 are disposed in high temperature area near printed board 14a. Hence the high temperature air near printed board 14a is securely exhausted, and printed board 14a, that is, cooling device 14 is cooled effectively.

In preferred embodiment 2, the location of intake port 18 and the location of exhaust port 19 are only examples, and the configuration is not particularly specified. That is, same action and effects are obtained if intake port 18 is disposed to communicate with the high pressure section in section 50 at the high pressure side of fan 7, and exhaust port 19 is disposed to communicate with the low pressure section of section 50a at the low pressure side of fan 7, and further if either one of intake port 18 and exhaust port 19 is disposed in high temperature area near printed board 14a.

Preferred Embodiment 3

Figure 11:
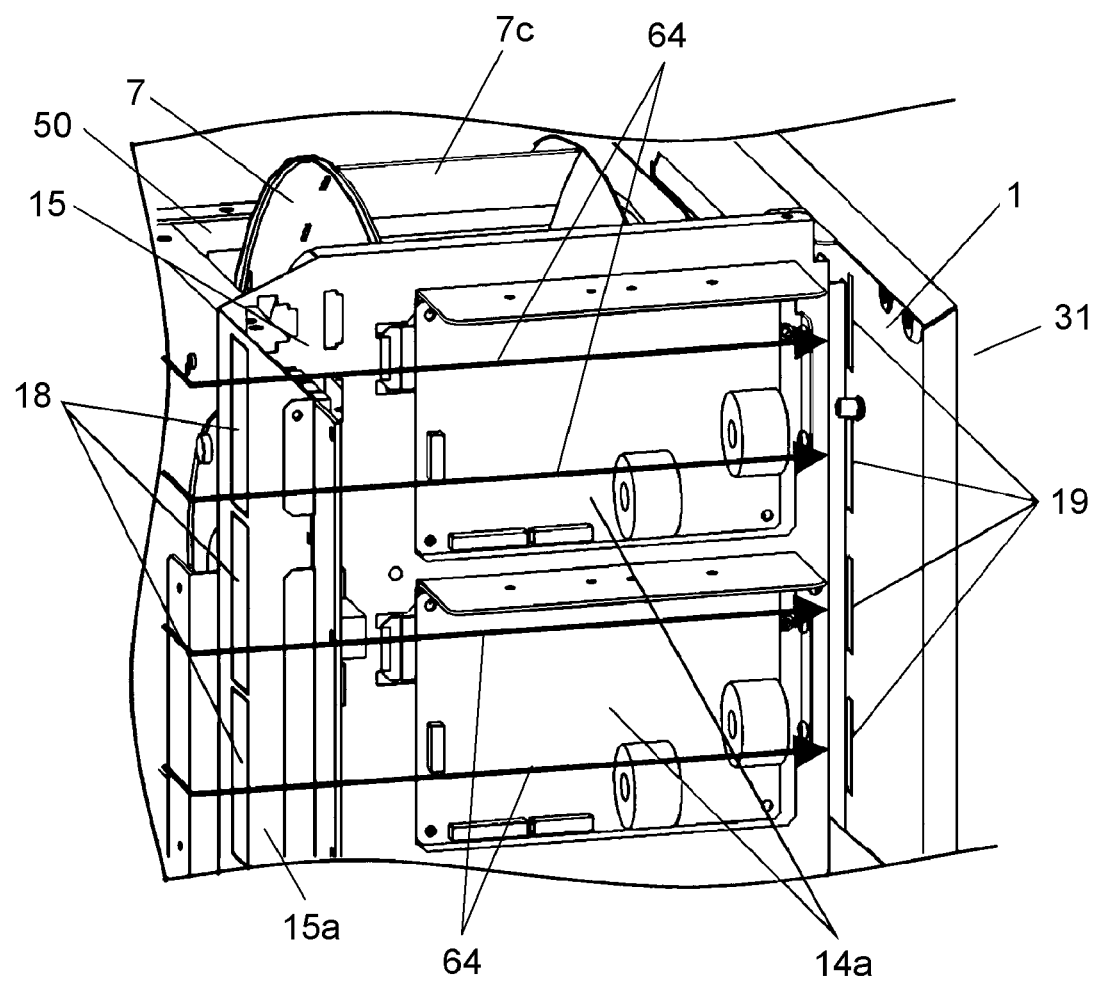
FIG. 11 is an internal schematic perspective view of controller box in a cooling device in preferred embodiment 3 of the present invention.

Preferred embodiment 3 of the present invention is described below while referring to the drawing. Same components as in preferred embodiments 1 and 2 are identified with same reference numerals, and detailed description is omitted. FIG. 11 is an internal schematic perspective view of controller box 15 in preferred embodiment 3 of the present invention.

Intake port 18 communicates with section 50 at the high pressure side of fan 7. Further, intake port 18 is provided on back side 15a of box 15 on an extension line linking exhaust port 19 and printed board 14a. Exhaust port 19 communicates with duct 17.

In this configuration, a part of the air blown out from fan 7 forms air stream 64 to flow from intake port 18 into box 15. The air flowing into box 15 cools printed board 14a, and flows almost straightly into exhaust port 19, and is exhausted from exhaust port 19 to outside of box 15. That is, the air is exhausted into duct 17.

Printed board 14a is disposed on the way of air stream 64 flowing straightly from intake port 18 to exhaust port 19. Hence, the high temperature air around printed board 14a is securely exhausted, and printed board 14a, that is, control device 14 is cooled effectively.

In preferred embodiment 3, the location of intake port 18 and the location of exhaust port 19 are only examples, and the configuration is not particularly specified. That is, same action and effects are obtained if printed board 14a, intake port 18, and exhaust port 19 are substantially disposed straightly.

Preferred Embodiment 4

Figure 12:
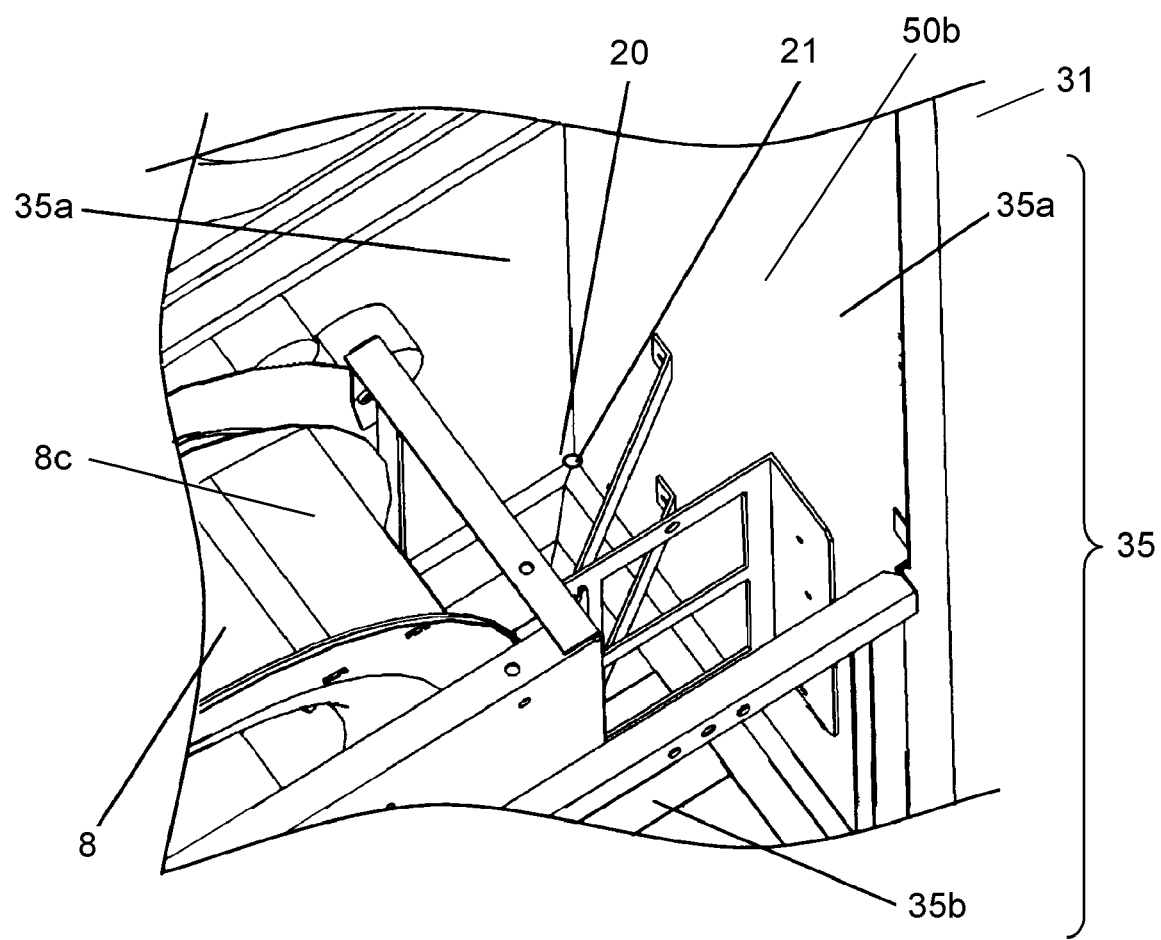
FIG. 12 is a magnified view of a corner area of a case accommodating an outdoor side turbo fan in a cooling device in preferred embodiment 4 of the present invention.

Preferred embodiment 4 of the present invention is described below while referring to the drawing. Same components as in preferred embodiments 1 to 3 are identified with same reference numerals, and detailed description is omitted. FIG. 12 is a magnified view of corner part 20 of case 35 accommodating outdoor side turbo fan 8 in preferred embodiment 4 of the present invention.

Case 35 is composed of plate metal member 35a and plate metal member 35b. At corner part 20 of plate metal member 35a and plate metal member 35b, end portions of plate metal members 35a, 35b abut against each other. Accordingly, in the abutting portion of corner part 20, a small hole communicating with outside of cooling device 31 is formed as drain hole 21.

Generally, corner part 20 abuts against a plurality of members facing the outside of cooling device 31. Further, the portion communicating with outside of cooling device 31 is treated by caulking as sealing process for preventing invasion of dust or rainwater from outside. In cooling device 31, however, since corner part 20 is not caulked, drain hole 21 is formed. Drain hole 21 functions for draining the rainwater invading into section 50b for accommodating fan 8 from outdoor air intake hole 45, and drains the rainwater invading into section 50b quickly. As a result, invasion of rainwater into the inside of box 4 is prevented.

The size of drain hole 21 should be small enough so as not to lower the cooling performance due to leak of the air blown by fan 8 massively outside of cooling device 31, and large enough to drain water securely.

The configuration of cooling device 31 in preferred embodiment 4 may be further added to cooling device 31 in preferred embodiments 1 to 3, and same action and effects are obtained.

Preferred Embodiment 5

Figure 13:
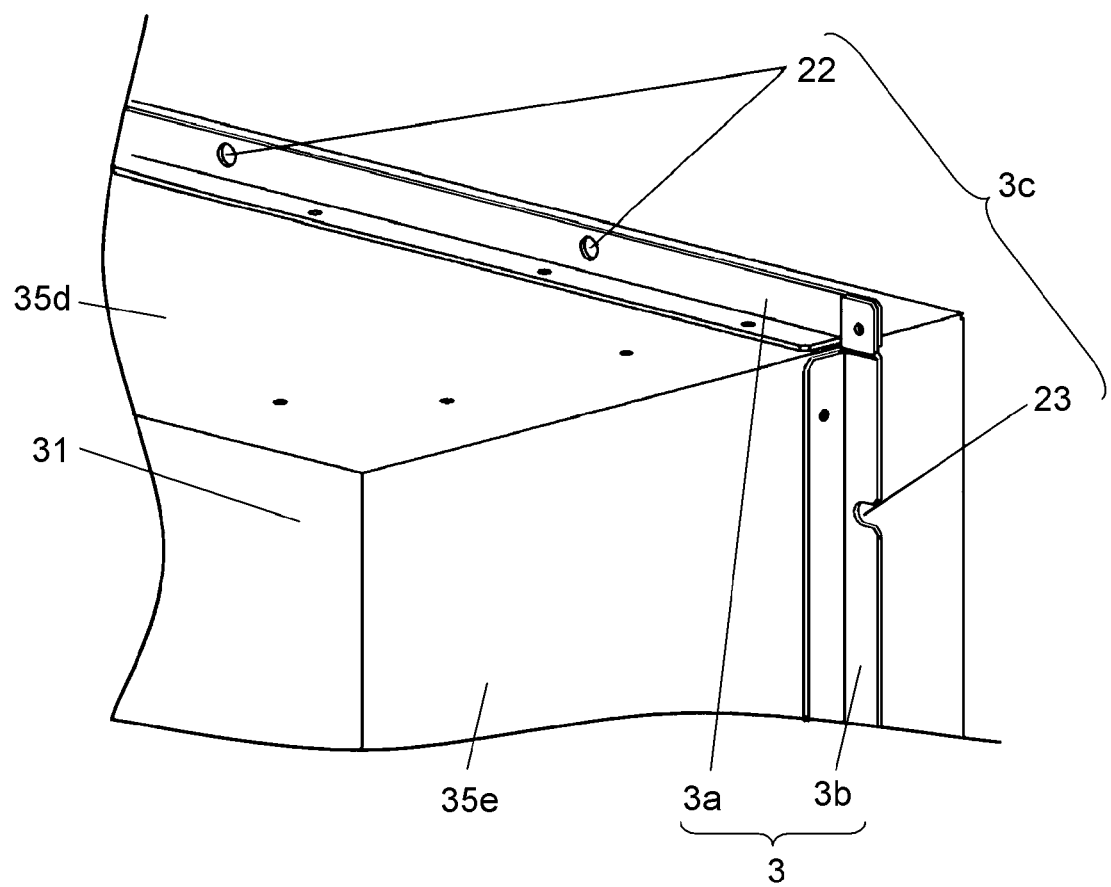
FIG. 13 is a partially magnified view of an opening portion of flange in a cooling device in preferred embodiment 5 of the present invention.

Preferred embodiment 5 of the present invention is described below while referring to the drawing. Same components as in preferred embodiments 1 to 4 are identified with same reference numerals, and detailed description is omitted. FIG. 13 is a partially magnified view of opening part 3c of flange 3 in preferred embodiment 5 of the present invention.

Flange 3 includes flange 3a as a first fixing member and flange 3b as a second fixing member. Flange 3a is attached to top face 35d of cooling device 31. Flange 3b is attached to both lateral faces 35e and bottom face 35f of cooling device 31. Opening part 3c for passing screw 5 has round hole 22 as a first opening part, and U-cut 23 as a second opening part.

Round hole 22 is formed in flange 3a, and U-cut 23 is formed in flange 3b. U-cut 23 has a U-shaped notch. Although not shown in FIG. 13, U-cut 23 is similarly formed in flange 3b attached to lateral face 35e and bottom face 35f at the opposite side of cooling device 31.

In this configuration, opening part 3c of flange 3a is round hole 22 of circular hole shape, and opening part 3c of flange 3b is U-cut 23 of U-shape. Hence as compared with opening part 3c formed of round holes only, the positioning and assembling efficiency is enhanced when assembling cooling device 31 into box 4.

When cooling device 31 is assembled in box 4, flange 3a exists in the upper part of screw 5 penetrating through round hole 22. Therefore, the rainwater is prevented from depositing on the upper part of screw 5 and staying in the upper part of screw 5. As a result, the rainwater existing in the upper part of screw 5 is prevented from invading into the inside of box 4 by running along the screw threads.

In the present preferred embodiment 5, opening part 3c of flange 3a has a round hole shape. However, same action and effects are obtained if opening part 3c of flange 3a has square hole, polygonal hole, or other shape capable of covering the upper part of screw 5 penetrating through opening part 3c. The notch shape of flange 3b is a U-cut. However, same action and effects are obtained as far as the end portion of flange 3b is an open shape, not limited to U-cut 23, possibly including V-cut and others.

The configuration of cooling device 31 in preferred embodiment 5 may be further added to cooling device 31 in preferred embodiments 1 to 4, and same action and effects are obtained.

Preferred Embodiment 6

Figure 14:
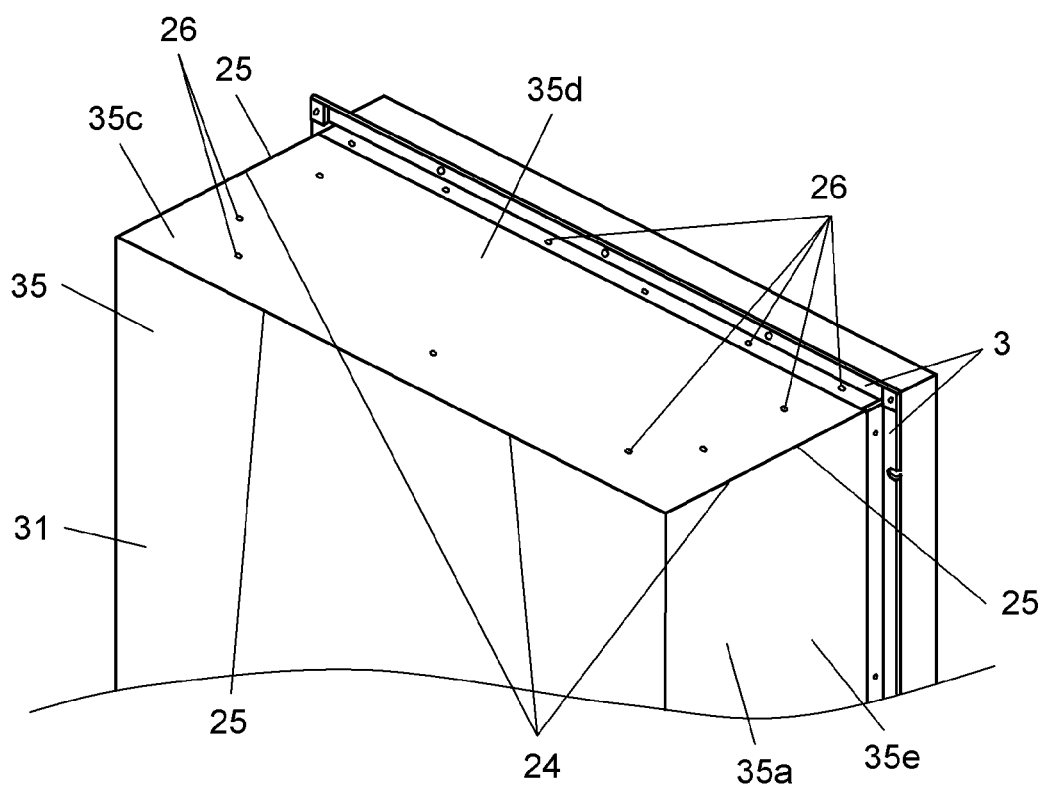
FIG. 14 is a schematic perspective view showing the top side before sealing process of cooling device in a cooling device in preferred embodiment 6 of the present invention.
Figure 15:
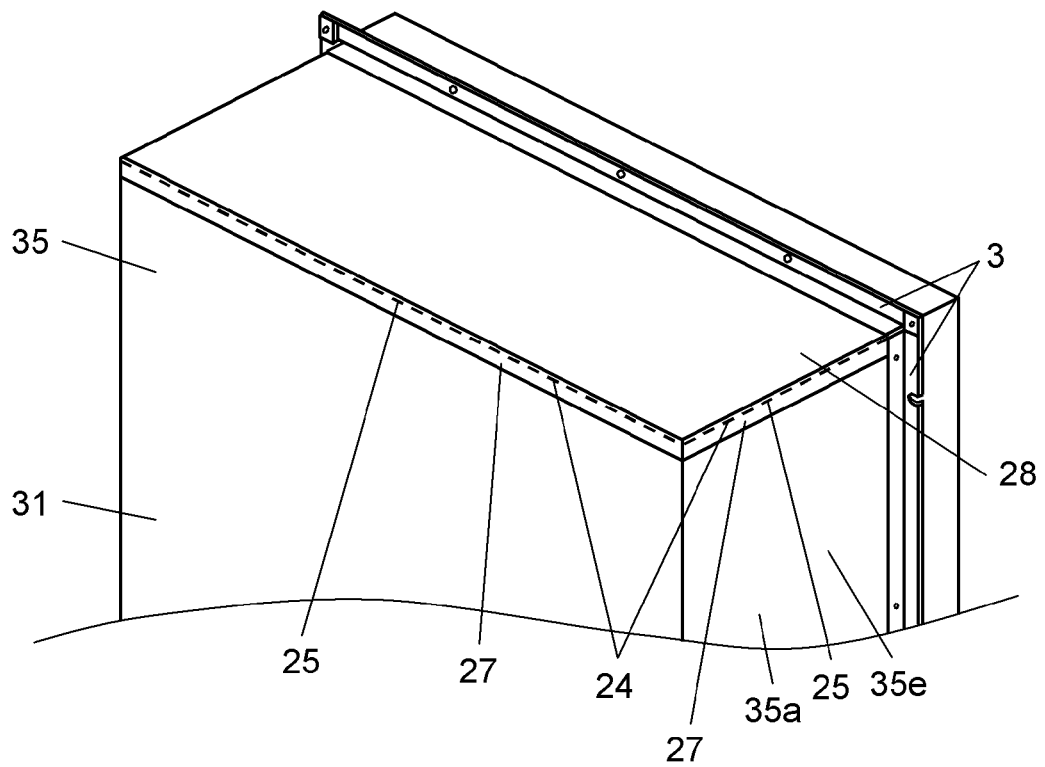
FIG. 15 is a schematic perspective view showing the top side after sealing process of the cooling device shown in FIG. 14.
Figure 16:
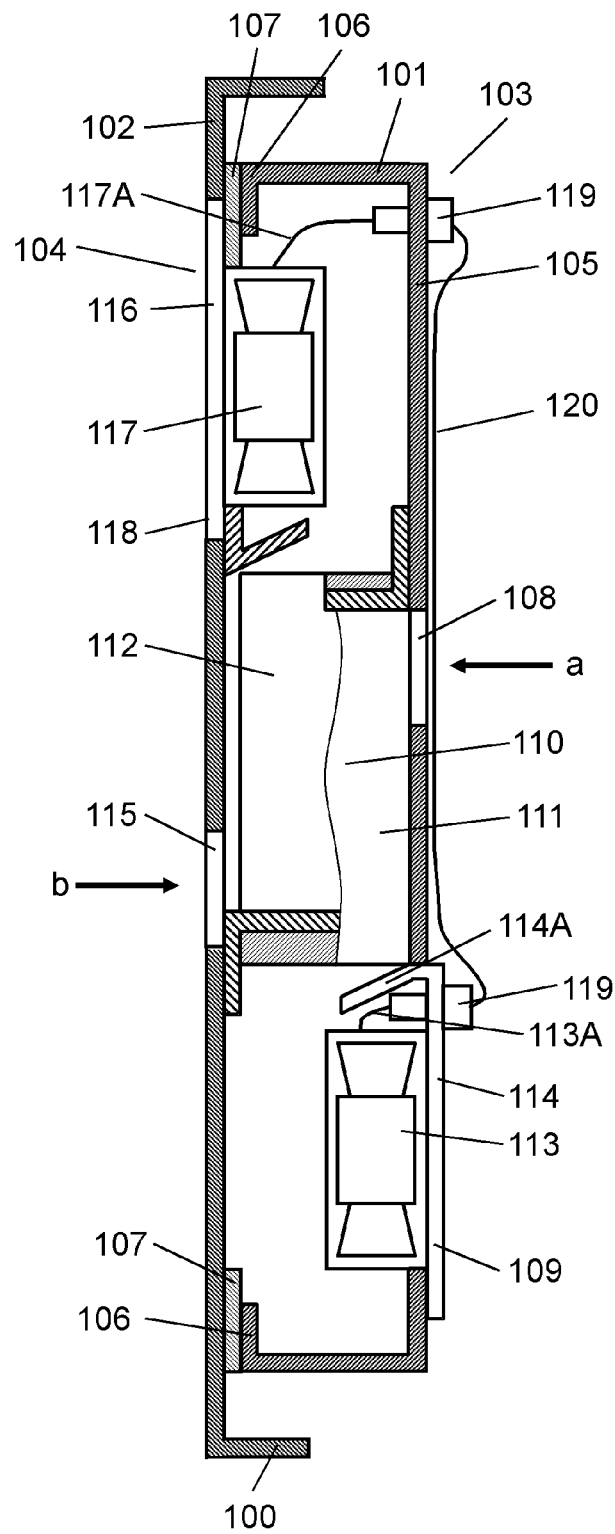
FIG. 16 is a side schematic sectional view of a conventional cooling device.

Preferred embodiment 6 of the present invention is described below while referring to the drawing. Same components as in preferred embodiments 1 to 5 are identified with same reference numerals, and detailed description is omitted. FIG. 14 is a schematic perspective view of top face 35d before sealing process of cooling device 31 in preferred embodiment 6 of the present invention. FIG. 15 is a schematic perspective view of top face 35d after sealing process of cooling device 31.

As shown in FIG. 14, the upper part of case 35 is composed of plate metal member 35a and plate metal member 35c. Ridge portion 24 of case 35 in the abutting portion of plate metal members 35a, 35c is filled with caulking agent 25 and sealing agent. Caulking agent 25 is applied for sealing of cooling device 31.

The junction of plate metal member 35a and plate metal member 35c, and the junction of case 35 and flange 3 are bonded by using rivets 26. Further, the portion bonded by using rivets 26 may be also sealed by using caulking agent 25.

Further, as shown in FIG. 15, after the caulking process of cooling device 31, ridge portion 24 formed by top face 35d and lateral face 35e is further adhered with waterproof tape 27 as sealing process. Top face 35d is adhered with sealing and insulating part 28 (hereafter called insulating part 28) as a member having sealing effect and insulating effect, so as to cover rivets 26. Insulating part 28 is formed by using polyethylene sheet. Since insulating part 28 is formed by using polyethylene sheet, a high sealing performance and excellent insulating performance of cooling device 31 is realized in a simple configuration.

By this configuration, ridge portion 24 is insulated in a double structure by caulking agent 25 and waterproof tape 27.

Therefore, if one sealing process is defective, the sealed state is maintained by other sealing process. Hence, if rainwater is collected in top face 35d, invasion of rainwater into cooling device 31 along the junction portion of plate metal member 35a and plate metal member 35c, and the junction portion with rivets 26 can be securely prevented.

Further, by the sealing action of insulating part 28, if cooling device 31 is installed outdoors, and rainwater is collected in top face 35d, invasion of rainwater into cooling device 31 is prevented. Further, by insulating action of insulating part 28, if cooling device 31 is installed outdoors, and top face 35d is exposed to direct sunlight, temperature elevation by sunlight of section 50 for accommodating fan 7 positioned at the rear side of top face 35d can be suppressed, and drop of cooling performance of cooling device 31 can be lessened.

Caulking agent 25 as sealing agent and waterproof tape 27 as sealing process in the present preferred embodiment are only examples, and are not particularly specified. Same action and effects are obtained by using members having similar waterproof and weatherproof properties and sealing properties of the junction portions.

A polyethylene sheet is used for insulating part 28. However, insulating part 28 is not limited to polyethylene sheet alone. Same action and effects are obtained if insulating part 28 is made of waterproof, water resistant and heat resistant materials.

The configuration of cooling device 31 in preferred embodiment 6 may be further added to cooling device 31 in preferred embodiments 1 to 5, and same action and effects are obtained.

INDUSTRIAL APPLICABILITY

The present invention is useful as a cooling device of a heating element storing box, such as a box-like structure installed outdoors such as mobile telephone base station or simple radio station, having heating elements such as communication devices in the inside, requiring cooling even in winter because the heat generation amount of heating elements is large, and having precision devices of which performance and life may be influenced by temperature, humidity, dust or rainwater.

What is claimed is:

1. A cooling device comprising:
   a box body provided in a heating element storing box, the heating element storing box for storing a heating element in its inside, wherein at least one side of the box body is formed by a detachable panel,
   an indoor air channel for sucking in and circulating air in the heating element storing box, an outdoor air channel for sucking in and circulating outdoor air,
   an indoor air blower for conveying air into the indoor air channel,
   an outdoor air blower for conveying air into the outdoor air channel,
   a heat exchanger having an indoor air flow-in port, and exchanging sensible heat between the air in the indoor air channel and the air in the outdoor air channel,
   a control device for controlling the indoor air blower and the outdoor air blower, and
   a control device accommodating unit accommodates the control device
   wherein the heat exchanger is disposed at the downstream side of the indoor air blower and the outdoor air blower,
   the indoor air flow-in port and the control device accommodating unit are disposed adjacent to a section that accommodates the indoor air blower, and impellers of the indoor air blower are sequentially opposite to the indoor air flow-in port and the control device accommodating unit, by rotation of the impellers, and a space is further formed between the indoor air flow-in port and the control device accommodating unit the control device accommodating unit has a flow-in port of the control device accommodating unit and a flow-out port of the control device accommodating unit for cooling and ventilating in the control device accommodating unit, the flow-in port of the control device accommodating unit communicates with the high pressure section of air blown by the indoor air blower, and the flow-out port of the control device accommodating unit communicates with an indoor air leading part for leading the air in the heating element accommodating unit into the indoor air intake port.

2. The cooling device of claim 1, wherein the flow-in port of the control device accommodating unit is disposed in a high temperature area in the control device accommodating unit.

3. The cooling device of claim 1, wherein the flow-out port of the control device accommodating unit is disposed in a high temperature area in the control device accommodating unit.

4. The cooling device of claim 1, wherein a high temperature area in the control device accommodating unit, the flow-in port of the control device accommodating unit, and the flow-out port of the control device accommodating unit are substantially disposed on a straight line.

5. The cooling device of claim 1, further comprising: a drain hole provided at a corner of a section of the box body for accommodating the outdoor air blower, and communicating with the outside.

6. The cooling device of claim 1, wherein the box body includes a top face, a bottom face and lateral faces, the cooling device further comprising:

a fixing member provided at the top face, the bottom face and both of the lateral faces of the box body, and having an opening part, a tightening member penetrating through the opening part for tightening the fixing member and the heating element storing box, and a sealing member formed between the fixing member and the heating element storing box, wherein the fixing member includes:

a first fixing member provided in the top face, and having a first opening part of hole shape, and a second fixing member provided in the bottom face and both lateral faces, and having a second opening part of notch shape.

7. The cooling device of claim 1, wherein the box body is:

formed of a plate member at a side different from the one side of the box body formed by the detachable panel, and at least a double sealing process is applied on a ridge portion formed between a side adjacent to the plate member and the plate member, wherein the side adjacent is different from the panel, and the plate member.

8. The cooling device of claim 1, further comprising: a sealing and insulating part provided on the top face of the box body.

9. The cooling device of claim 8, wherein the sealing and insulating part is made of a polyethylene sheet.

* * * * *